United States Patent
Nam et al.

(10) Patent No.: US 7,372,747 B2
(45) Date of Patent: May 13, 2008

(54) FLASH MEMORY DEVICE AND VOLTAGE GENERATING CIRCUIT FOR THE SAME

(75) Inventors: Sang-Wan Nam, Yongin-si (KR); Dae-Han Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 118 days.

(21) Appl. No.: 11/482,447

(22) Filed: Jul. 7, 2006

(65) Prior Publication Data

US 2007/0053228 A1    Mar. 8, 2007

(30) Foreign Application Priority Data

Sep. 8, 2005  (KR) .................... 10-2005-0083799

(51) Int. Cl.
*G11C 5/14* (2006.01)
(52) U.S. Cl. .................................. 365/189.09; 365/226
(58) Field of Classification Search ........... 365/189.09, 365/226, 227
See application file for complete search history.

(56) References Cited

U.S. PATENT DOCUMENTS

| | | | |
|---|---|---|---|
| 5,798,966 A | 8/1998 | Keeney | |
| 5,862,096 A * | 1/1999 | Yasuda et al. | ............... 365/229 |
| 5,986,959 A * | 11/1999 | Itou | ......................... 365/226 |
| 6,445,616 B2 | 9/2002 | Kim | |
| 6,768,676 B2 | 7/2004 | Hirano | |
| 7,227,804 B1 * | 6/2007 | Kothandaraman et al. | .. 365/229 |
| 2004/0174150 A1 | 9/2004 | Zhang et al. | |

FOREIGN PATENT DOCUMENTS

| | | |
|---|---|---|
| JP | 2003-223791 | 8/2003 |
| JP | 2004-241122 | 8/2004 |
| JP | 2004-273103 | 9/2004 |
| KR | 100164814 | 9/1998 |
| KR | 1020010002603 A | 1/2001 |
| KR | 1020010005090 | 1/2001 |
| KR | 1020030000835 | 1/2003 |
| KR | 1020040079119 A | 9/2004 |

* cited by examiner

*Primary Examiner*—Vu A. Le
(74) *Attorney, Agent, or Firm*—F. Chau & Associates, LLC

(57) ABSTRACT

A flash memory device and a voltage generating circuit for the same. The flash memory includes a memory cell array configured with a plurality of memory cells, a voltage generating circuit for generating a plurality of constant voltages to be applied to the memory cell array, and a selection circuit for selecting one constant voltage among the plurality of the constant voltages and applying the selected one constant voltage to the memory cell array. The voltage generating circuit discharges a leakage current input by the selection circuit through a voltage division path, which generates the constant voltages.

11 Claims, 7 Drawing Sheets

FLASH MEMORY DEVICE AND VOLTAGE GENERATING CIRCUIT FOR THE SAME

CROSS-REFERENCE TO RELATED PATENT APPLICATIONS

This application claims priority to Korean Patent Application No. 2005-83799, filed on Sep. 8, 2005, in the Korean Intellectual Property Office, the disclosure of which is incorporated by reference herein.

BACKGROUND OF THE INVENTION

1. Technical Field

The present disclosure relates to a semiconductor memory device, and more particularly, to a flash memory device and a voltage generating circuit for the same.

2. Discussion of the Related Art

Semiconductor memory is most commonly used in the design of microprocessor based digital logic and can be found in a wide variety of technologies ranging from satellites to consumer electronics. Therefore, advances in the technology for fabricating semiconductor memory with high integration (information storing capacity) and high speed performance are of great importance.

Semiconductor memory devices are mainly classified into volatile memory devices and nonvolatile memory devices. A volatile memory device writes and reads data while power is applied thereto, whereas the data is lost when the power is turned off. On the contrary, a nonvolatile memory device such as a mask read-only memory (mask ROM, MROM), a programmable ROM (PROM), an erasable and programmable ROM (EPROM), an electrically erasable and programmable EPROM (EEPROM), and so forth, can retain the data when the power is turned off.

The data storage state of a nonvolatile memory device may be permanent or reprogrammable according to the fabrication technology. Among nonvolatile memory devices, the memory contents of MROM, PROM and EPROM are not easily modified by users. On the contrary, since the memory contents of an EEPROM can be electrically erased and modified, EEPROMs are increasingly applied to systems that require continuous update. In particular, it is very advantageous to apply a flash EEPROM (hereinafter, referred to as a flash memory) to a high capacity auxiliary memory device because its integrity is higher than a conventional EEPROM.

Flash memory may be classified into a NOR type and a NAND type according to the connection state between a cell and a bit line. NOR flash memory is configured such that two or more cell transistors are connected to one bit line in parallel. NOR flash memory stores data using channel hot electrons, and erases the data using Fowler-Nordheim (F-N) tunneling. NAND flash memory is configured such that two or more cell transistors are connected to one bit line in series. NAND flash memory writes and erases data using the F-N tunneling. Although NOR flash memory with high information storage capacity uses large amounts of current, it can easily handle high speeds. In recent years, the information storage capacity of NOR flash memory has been great improved by employing a multi level cell (MLC).

When a single-bit of data is written to flash memory, the data stored in a unit cell may be represented as two threshold voltage distributions corresponding to data '1' and '0'. On the contrary, when multiple bits of data are written to flash memory, the data stored in a unit cell may be represented as four threshold voltage distributions corresponding to data '11', '10', '00' and '01', respectively. As the number of data bits stored in each cell increases, a greater number of voltage levels are required for programming, erasing, and reading out the respective data. Therefore, it is important to be able to generate each voltage more accurately and precisely to program, erase, and read out data stored in flash memory. There is also a need for flash memory that can maintain the levels of each generated voltage without fluctuation.

SUMMARY OF THE INVENTION

An exemplary embodiment of the present invention provides a flash memory device including a memory cell array configured with a plurality of memory cells; a voltage generating circuit, and a selection circuit. The voltage generating circuit is for generating a plurality of constant voltages to be applied to the memory cell array. The selection circuit is for selecting one constant voltage among the plurality of the constant voltages and applying the selected one constant voltage to the memory cell array. The voltage generating circuit discharges a leakage current supplied by the selection circuit through a voltage division path, which generates the constant voltages.

An exemplary embodiment of the voltage generating circuit includes a charge pump, a first type voltage regulator, and a plurality of second type voltage regulators. The charge pump is for generating a voltage higher than a power voltage through charge-pumping. The first type voltage regulator is for generating a plurality of stand-by constant voltages and control signals by dividing the voltage generated by the charge pump during a stand-by period. Each of the second type voltage regulators outputs a corresponding one of the stand-by constant voltages to the selection circuit during the stand-by period, and outputs active constant voltages corresponding to the stand-by constant voltages to the selection circuit by dividing the voltage generated by the charge pump during an active period. The control circuit is for controlling the charge pumping operation in response to the control signals.

An exemplary embodiment of the first type voltage regulator includes a plurality of first output terminals, which output the stand-by constant voltages.

The first output terminals are connected to respective output terminals of the second type voltage regulator.

An exemplary embodiment of the first type voltage regulator discharges a leakage current supplied by at least one of the first output terminals through the voltage division path, which generates the stand-by voltages.

An exemplary embodiment of the voltage division path includes an input terminal and a plurality of resistors. The input terminal is for receiving the voltage generated by the charge pump. The plurality of resistors are connected in series between the input terminal and a ground for dividing the input voltage.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Hereinafter, exemplary embodiments of the present invention will be described in detail with reference to the attached drawings. An exemplary embodiment of the present invention provides a flash memory device which includes: a memory cell array, a voltage generating circuit, and a selection circuit. The memory cell array is configured with a plurality of memory cells. The voltage generating circuit is for generating a plurality of constant voltages to be applied to the memory cell array. The selection circuit is for selecting one constant voltage among the plurality of the constant voltages and applying the selected one constant voltage to the memory cell array. The voltage generating circuit discharges a leakage current supplied by the selection circuit through a voltage division path. The fluctuation of voltages generated by the voltage generating circuit is reduced so that it is possible to more accurately and stably perform a program, an erase, and a read-out operation on the flash memory device.

Figure 1:
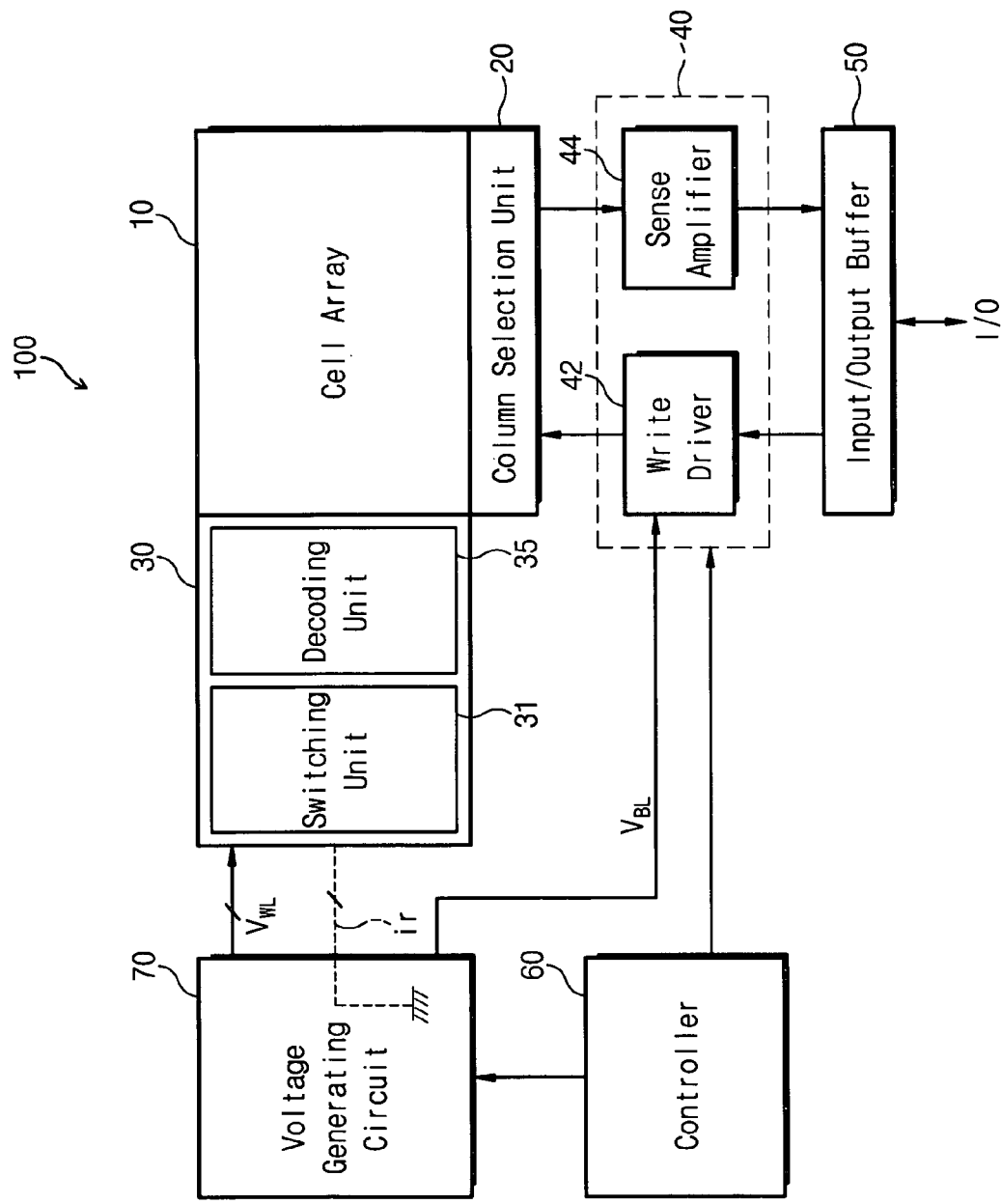
FIG. 1 is a block diagram illustrating a flash memory device according to an exemplary embodiment of the present invention.

FIG. 1 is a block diagram illustrating a flash memory device 100 according to an exemplary embodiment of the present invention. In FIG. 1, the flash memory is embodied employing a multi level cell (MLC) data storage type.

Referring to FIG. 1, the flash memory device 100 includes a memory cell array 10, a row selection unit 30, a data input/output circuit 40, an input/output buffer 50, a controller 60, and a voltage generating circuit 70.

The memory cell array 10 includes a plurality of memory cells arranged at intersection regions where a plurality of rows, i.e., word lines, and a plurality of columns, i.e., bit lines, are intersected with each other. The voltage generating circuit 70 generates a plurality of constant voltages needed for the program, erase, and read-out operations of the memory cell. The plurality of constant voltages generated by the voltage generating circuit 70 are applied to a corresponding word line through the row selection unit 30. The row selection unit 30 is configured with a switching unit 31 and a decoding unit 35. The switching unit 31 selects one constant voltage among the plurality of constant voltages generated by the voltage generating circuit 70. The decoding unit 35 selects a word line to which the selected constant voltage is applied. The column selection unit 20 selects a bit line connected to a predetermined cell to be programmed or read out among the plurality of memory cells incorporated in the selected word line. The input/output buffer 50 stores data to be programmed in the memory cell array 10 and data sensed from the memory cell array 10. The data input/output circuit 40 is configured with a write driver 42 and a sense amplifier 44. The write driver 42 receives the data to be programmed from the input/output buffer 50, and performs the program operation on the memory cell. The sense amplifier 44 senses the programmed data in the selected memory cell. The data sensed by the sense amplifier 44 is stored in the input/output buffer 50. The controller 60 controls the operation of the program, the erase, and the read-out operations of the flash memory.

While the constant voltage generated by the voltage generating circuit 70 is applied to the row selection unit 30 for subsequent application to the cell array 10, a leakage current $i_r$ may occur due to the structural characteristics of the row selection unit 30. The leakage current $i_r$ may cause fluctuation of the levels of the constant voltages generated by the voltage generating circuit 70. An exemplary embodiment of the voltage generating circuit 70, according to an exemplary embodiment of the present invention, has a predetermined structure capable of discharging the leakage current $i_r$ generated by the row selection unit 30 when the constant voltage is applied. As a result, it is possible to stably apply the plurality of constant voltages needed for programming, erasing, and reading out the data stored in the flash memory.

Figure 2:
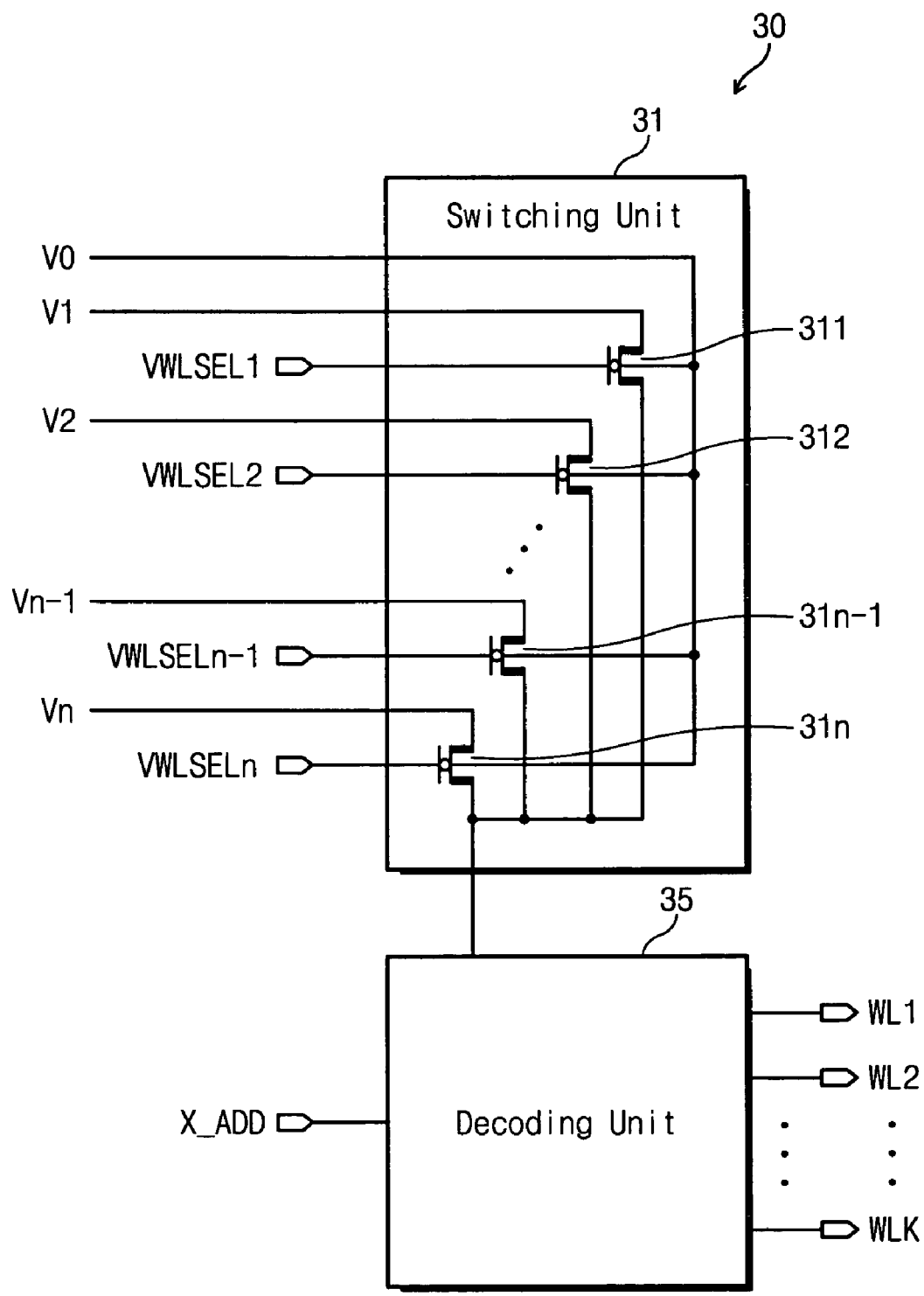
FIG. 2 is a circuit diagram illustrating a row selection unit of FIG. 1 according to an exemplary embodiment of the invention.

FIG. 2 is a circuit diagram illustrating the row selection unit 30 of FIG. 1, according to an exemplary embodiment of the present invention. Referring to FIG. 2, the row selection unit 30 is configured with the switching unit 31 and the decoding unit 35. The switching unit 31 is provided with a plurality of p-type MOS transistors 311, 312, ..., 31n-1, and 31n. The MOS transistors 311, 312, 31n-1, and 31n act as switches so that they receive a plurality of constant voltages V0, V1, V2, ... Vn-1, and Vn, respectively, and select to output one among the input constant voltages V0, V1, V2, ... Vn-1, and Vn. The switching operation of the MOS transistors 311, 312, ..., 31n-1, and 31n is controlled by voltage select signals VWLSEL1, VWLSEL2, ..., VWLSELn-1, VWLSELn generated by the controller 60.

In response to an externally applied address X_ADD, the decoding unit 35 selects a word line among the plurality of word lines to which the selected constant voltage is applied. Since the construction of the decoding unit 35 is well known to those skilled in the art, a further detailed description of the decoding unit 35 is not required.

Figure 3:
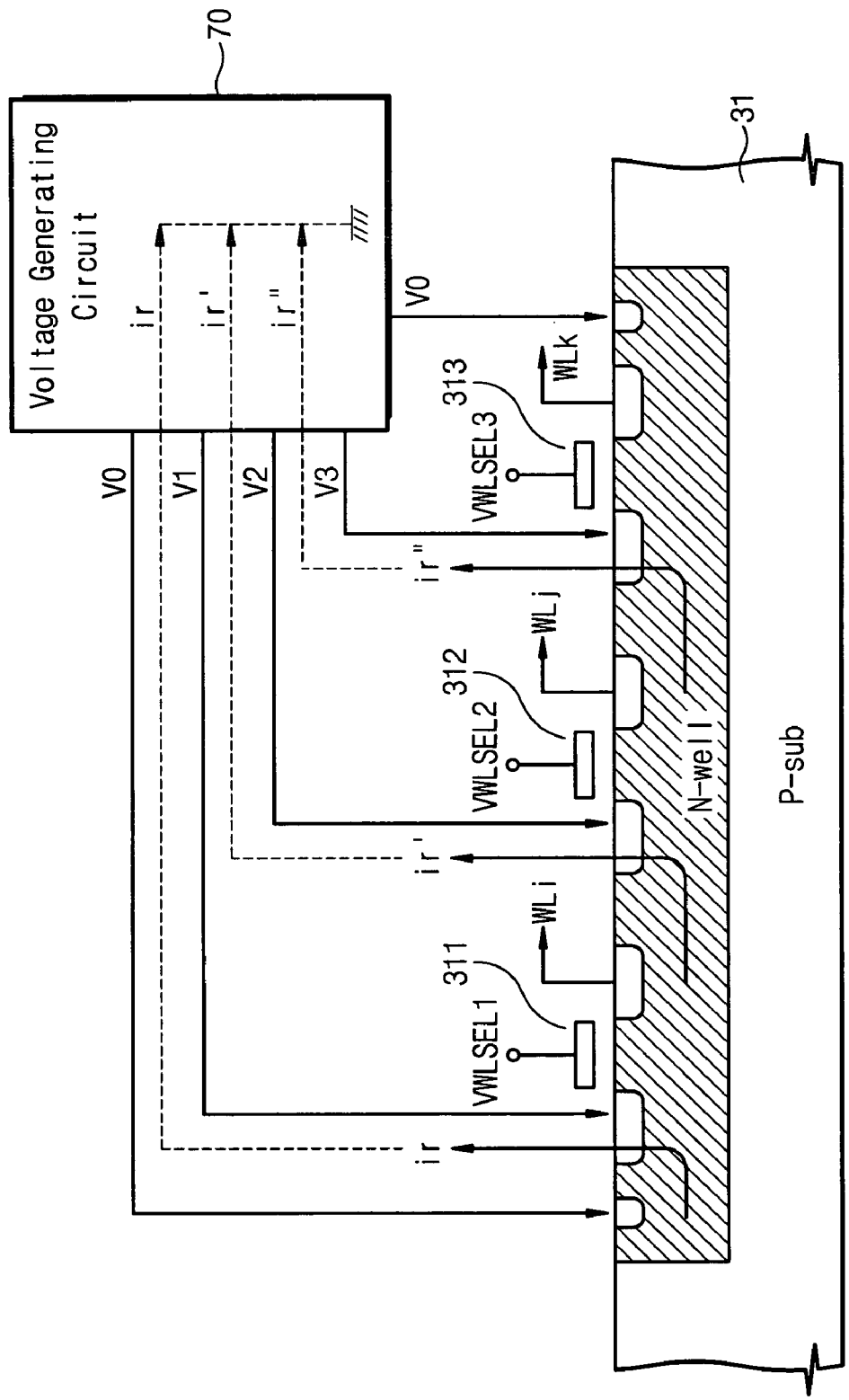
FIG. 3 is a diagram illustrating a cross-sectional view of a switching unit of FIG. 2 according to an exemplary embodiment of the invention.

FIG. 3 is a diagram illustrating a cross-sectional view of the switching unit 31 of FIG. 2, according to an exemplary embodiment of the present invention. In FIG. 3, transistors 311, 312 and 313 are illustrated from among the plurality of p-type MOS transistors 311, 312, ..., 31n-1, and 31n included in the switching unit 31.

Referring to FIGS. 2 and 3, the p-type MOS transistors 311, 312 and 313 included in the switching unit 31 are formed in the same well to minimize the size of the chip. A first voltage V0 generated by a charge pump 79 is applied to the well region of the switching unit 31. The first voltage V0 has the highest level among the plurality of constant voltages V0, V1, V2, ... Vn-1, and Vn generated by the voltage generating circuit 70. A second voltage V1 at a level lower than the first voltage V0, is applied to a source terminal of a first MOS transistor 311. Likewise, a third voltage V2 and a fourth voltage V3 are applied to source terminals of a second and third MOS transistors 312 and 313, respectively, wherein the level of the third voltage is lower than that of the second voltage and the level of the fourth voltage is lower than that of the third voltage.

First to third voltage select signals VWSEL1, VWSEL2, and VWSEL3 generated by the controller 60 are applied to gate terminals of first to third MOS transistors 311, 312 and 313, respectively. The voltage select signals VWSEL1, VWSEL2, and VWSEL3 have a voltage level of 0 V when the corresponding MOS transistor is selected. As a result, the corresponding MOS transistor is turned on so that the voltage supplied by the source terminal can be output through a drain terminal. The voltage select signals VWSEL1, VWSEL2, and VWSEL3 have the same voltage level as the first voltage V0 when the corresponding MOS transistor is not selected. The corresponding MOS transistor maintains a floating state so that the voltage supplied by the source terminal cannot be output. This switching operation is made possible by applying the first voltage V0 to the well region that is shared by the first to the third MOS transistors 311, 312 and 313.

Since the first voltage V0 is commonly applied to the well region of the first to third MOS transistors 311, 312 and 313, there is a voltage difference between the first voltage V0 and the voltage applied to the source terminal of each transistor 311, 312, and 313. As the time during which the voltage is applied to the switching unit 31 increases, and the level of the voltage applied to the source terminal of each transistor decreases, the voltage difference increases. This voltage difference causes a reverse leakage current $i_r$, $i_r'$ and $i_r''$ to flow into the voltage generating circuit 70. The reverse leakage current $i_r$, $i_r'$ and $i_r''$ causes fluctuations in the levels of constant voltages generated by the voltage generating circuit 70. The voltage generating circuit 70 may be configured such that the reverse leakage current $i_r$, $i_r'$ and $i_r''$ is discharged, thereby maintaining the constant voltages generated by the voltage generating circuit 70.

Figure 4:
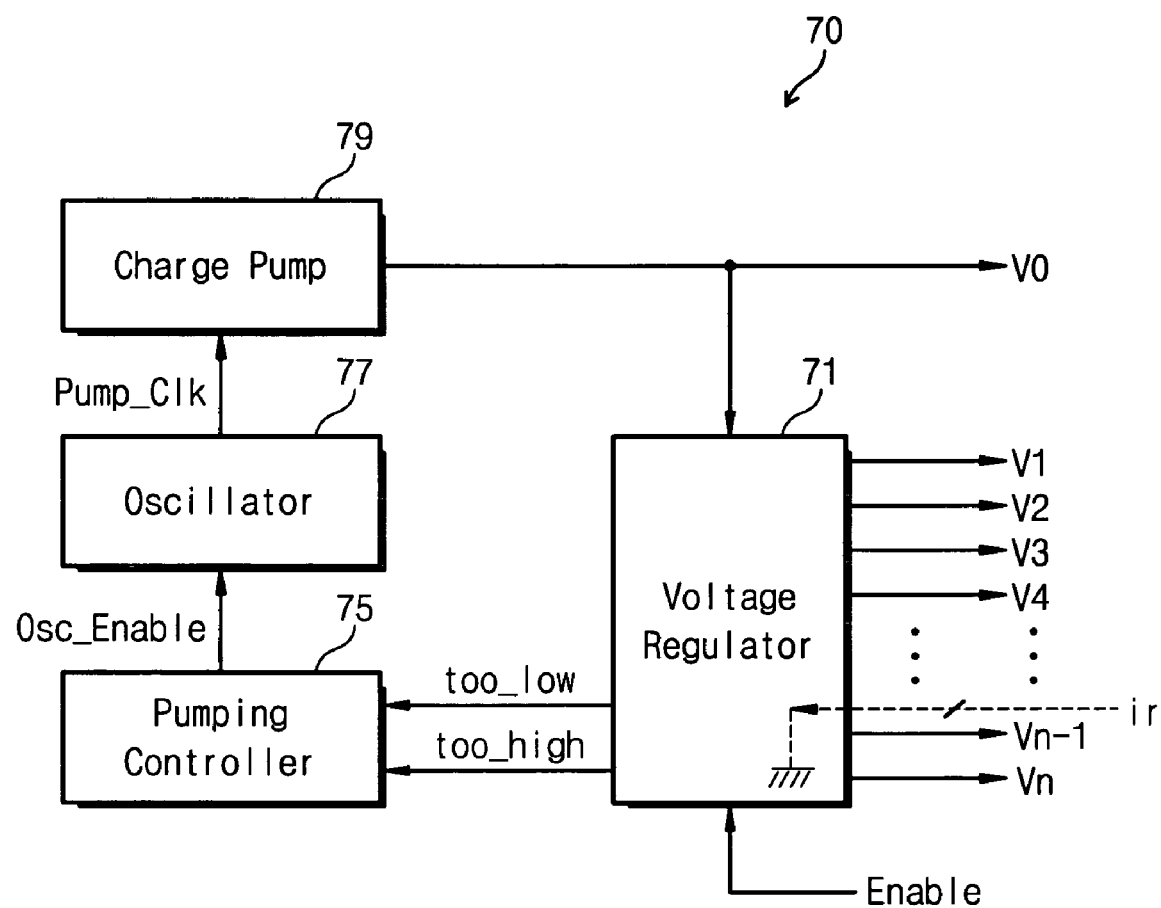
FIG. 4 is a block diagram illustrating a voltage generating circuit of FIG. 1 according to an exemplary embodiment of the invention.

FIG. 4 is a block diagram illustrating an exemplary embodiment of the voltage generating circuit 70 of FIG. 1, according to an exemplary embodiment of the present invention.

Referring to FIG. 4, the voltage generating circuit 70 includes a voltage regulator 71, a pumping controller 75, an oscillator 77, and a charge pump 79.

The charge pump 79 generates a high voltage, i.e., the first voltage V0, which is higher than a power voltage. The voltage regulator 71 generates the plurality of constant voltages V1, V2, V3, . . . , Vn by dividing the first voltage V0 generated by the charge pump 79. The plurality of constant voltages V1, V2, V3, . . . , Vn generated by the voltage regulator 71 have respective stand-by voltage levels (refer to a solid line in graph of FIG. 7) and active voltage levels (refer to a dotted line in graph of FIG. 7), depending on an activation state of an enable signal Enable generated by the controller 60. The stand-by voltage level means a voltage level of a stand-by state prior to applying the constant voltages V1, V2, V3, . . . , Vn to word lines. The active voltage level represents a voltage level when the plurality of constant voltages V1, V2, V3, . . . , Vn generated by the voltage regulator 71 are actually applied to the word lines. The active voltage level may be higher than the stand-by voltage level.

The voltage regulator 71 generates a first control signal too_low indicating that the stand-by voltage level of the first voltage V0 is lower than a level of a predetermined reference voltage. The voltage regulator 71 generates a second control signal too_high indicating that the active voltage level of the first voltage V0 is higher than a level of the predetermined reference voltage.

The pumping controller 75 generates an oscillation enable signal Osc_Enable in response to the first and second control signals too_low and too_high generated by the voltage regulator 71. For instance, when the voltage regulator 71 generates the first control signal too_low, the pumping controller 75 generates an activated oscillation enable signal Osc_Enable. When the voltage regulator 71 generates the second control signal too_high, the pumping controller 75 generates a deactivated oscillation enable signal Osc_Enable. The oscillator 77 generates a pumping clock signal Pump_Clk in response to the activated oscillation enable signal Osc_Enable.

The charge pump 79 performs a charge pumping in response to the pumping clock signal Pump_Clk, thereby generating the first voltage V0. The first voltage V0 is fed back to the voltage regulator 71 for regulating the pumping operation of the charge pump 79. The first voltage V0 is divided through the voltage regulator 71. The first voltage V0 is used for generating the plurality of constant voltages V1, V2, V3, . . . , Vn of which all the voltage levels are lower than that of the first voltage V0. The plurality of constant voltages V1, V2, V3, . . . , Vn generated by the voltage regulator 71 are used for the program, the erase, and the read-out operations of the flash memory. The voltage regulator 71 also discharges the reverse leakage current $i_r$ flowing into the voltage generating circuit 70 by using voltage division paths, which generate the plurality of constant voltages V1, V2, V3, . . . , Vn.

Figure 5:
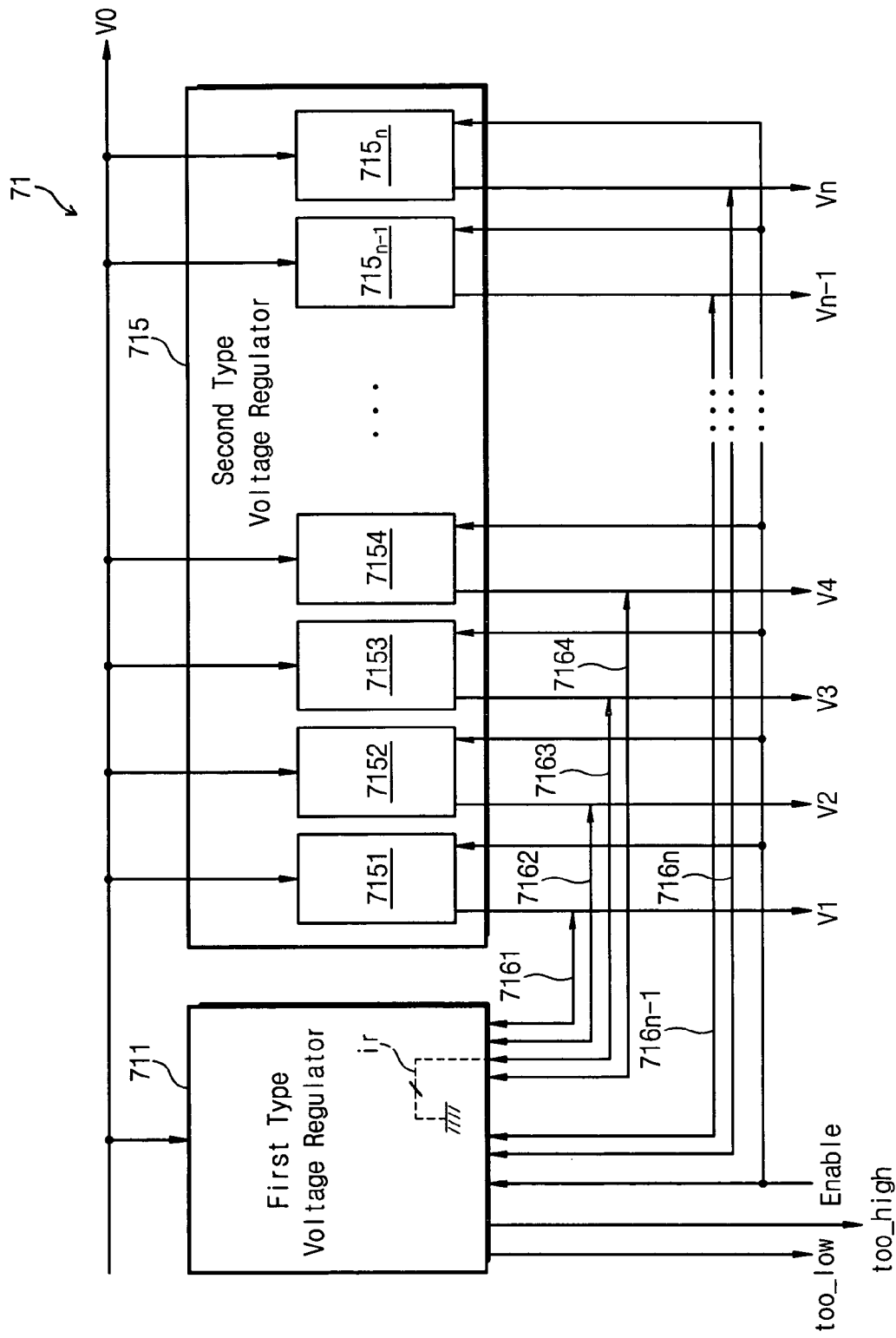
FIG. 5 is a block diagram illustrating a voltage regulator of FIG. 4 according to an exemplary embodiment of the invention.
Figure 6:
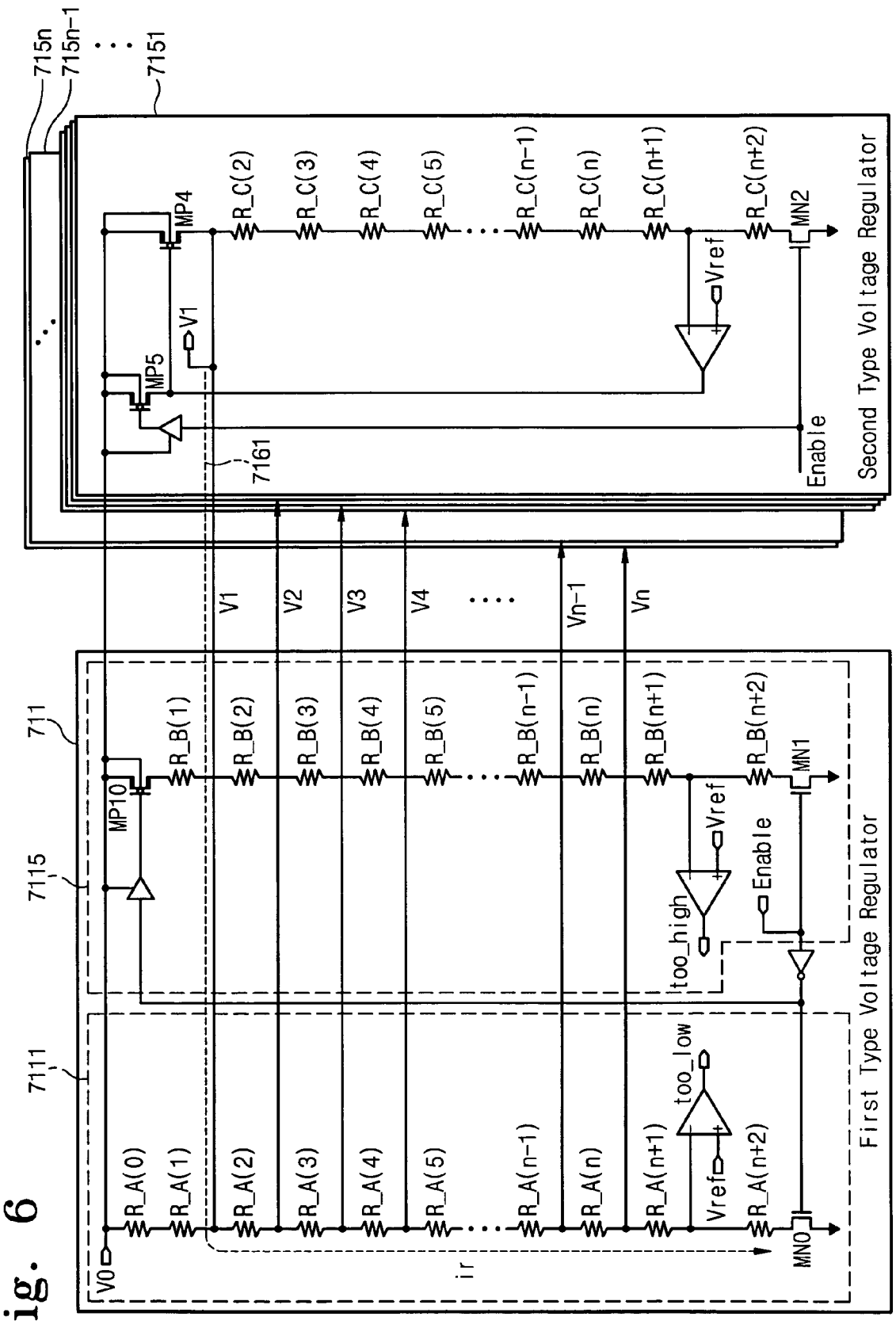
FIG. 6 is a circuit diagram illustrating first and second voltage regulators of FIG. 5 according to an exemplary embodiment of the invention.

FIG. 5 is a block diagram illustrating an exemplary embodiment of the voltage regulator 71 of FIG. 4, according to an exemplary embodiment of the present invention. FIG. 6 is a circuit diagram illustrating exemplary embodiments of the first and second type voltage regulators 711 and 715 of FIG. 5, according to an exemplary embodiment of the present invention.

Referring to FIGS. 5 and 6, the voltage regulator 71 includes a first type voltage regulator 711 and a second type voltage regulator 715 having a plurality of second type voltage regulators 7151, 7152, . . . , 715n. The first type voltage regulator 711 includes a first regulating unit 7111 and a second regulating unit 7115.

The first regulating unit 7111 includes an input terminal receiving the first voltage V0 generated by the charge pump 79, a plurality of resistors R_A(0), R_A(1), R_A(2), . . . , R_A(n+2) connected in series between the input terminal and a ground, a comparator, and a plurality of output terminals. The output terminals included in the first regulating unit 7111 are connected to corresponding input terminals of the second type voltage regulators 7151, 7152, . . . , 715n (refer to reference numerals 7161, 162, . . . , 716n-1, 716n).

The first regulating unit 7111 is enabled while the enable signal Enable generated by the controller 60 is deactivated, i.e., during a stand-by period. The first regulating unit 7111 divides the first voltage V0 through the plurality of resistors R_A(0), R_A(1), R_A(2), . . . , R_A(n+2) during the stand-by period, thereby generating a plurality of stand-by constant voltages. The generated plurality of stand-by constant voltages are transferred to the second type voltage regulator 715 through the output terminals. The second type voltage regulator 715 applies the plurality of stand-by constant voltages to the row selection unit 30 (refer to the solid line in the graph of FIG. 7). The plurality of stand-by constant voltages are continuously applied to the row selection unit 30 until the operation mode of the flash memory device reaches an active mode and a constant voltage is applied to the memory cell array.

While the first regulating unit 7111 generates the stand-by constant voltages, the comparator generates the first control signal too_low based on voltage division results. For example, the comparator compares a certain voltage among the divided plurality of voltages with a predetermined reference voltage Vref, wherein the certain voltage is the lowest-level voltage Vn which has been lowered to a predetermined level. If the reference voltage Vref is higher than the certain voltage, the comparator generates the first control signal too_low. While the first control signal too_low is generated, the charge pump 79 performs a pumping operation, thereby generating the first voltage V0 with a constant level.

The second regulating unit 7115 includes a plurality of resistors and a comparator like the first regulating unit 7111. However, the resistance of the resistors used in the second regulating unit 7115 is different from the first regulating unit 7111. For example, the resistors of the second regulating unit 7115 have a lower resistance than those of the first regulating unit 7111. Thus, the output of the second regulating unit 7115 has a steeper voltage increment than the output of the first regulating unit 7111.

The second regulating unit 7115 is enabled while the enable signal Enable generated by the controller 60 is activated, i.e., during an active period. The second regulating unit 7115 controls the pumping operation of the charge pump 79 during the active period. The second regulating unit 7115 divides the first voltage V0 through a plurality of resistors during the active period. The second regulating unit 7115 compares the voltage division result with a predetermined reference voltage Vref through the comparator. If the voltage division result is higher than the reference voltage Vref, the comparator generates the second control signal too_high. The charge pump 79 does not output a voltage signal while the second control signal too_high is generated. Thus, the first voltage V0 generated by the charge pump 79 can maintain a level less than a predetermined level. The voltage division result used for generating the second control signal too_high in the second regulating unit 7115 is a result of using the same resistance ratio as the first regulating unit 7111, although resistance values of individual resistors within the first regulating unit 7111 may be different from resistance values of individual resistors in the second regulating unit 7115.

The stand-by period indicates a mode where the flash memory 100 does not perform the program, the erase, the read operation, etc. Whereas, the active period represents a mode where the flash memory device 100 exits from the stand-by mode and performs the program, the erase, and the read operations on the memory cell array 10. The voltage generating circuit 70 generates an active constant voltage which is at a level higher than that of the stand-by constant voltage during the active period. The active constant voltage generated during the active period is applied to the memory cell array 10 by passing through the row selection unit 30. The voltage applied to the word line during the active period is substantially generated by the second type voltage regulators 7151, 7152, . . . , 715n.

The output terminal of each of the second type voltage regulators 7151, 7152, . . . , 715n is connected to a corresponding output terminal of the first type voltage regulator 711. During the stand-by period, the plurality of stand-by constant voltages generated by the first regulating unit 7111 are applied to the corresponding second type voltage regulators 7151, 7152, . . . , 715n through the output terminals thereof. The second regulator 715 maintains a deactivated state during the stand-by period. During the stand-by period, the second type voltage regulator 715 outputs the voltage division result, i.e., the stand-by constant voltages, applied by the first regulating unit 7111. The output of the second type voltage regulator 715 is applied to the switching unit 31 included in the row selection unit 30.

The second type voltage regulators 7151, 7152, . . . , 715n generate respective active constant voltages to be applied to the word lines in response to the activated enable signal Enable. Each of the second type voltage regulators 7151, 7152, . . . , 715n includes a plurality of resistors for dividing the first voltage V0 generated by the charge pump 79, and a comparator for controlling the division operation based on the voltage division result. The resistance ratio among the resistors in each of the second type voltage regulators 7151, 7152, . . . , 715n is different from one another. Further, the resistors in each of the second type voltage regulators 7151, 7152, . . . , 715n is configured such that the resistances thereof should be lower than those of the resistors in the first regulating unit 7111. The output of each of the second type voltage regulators 7151, 7152, . . . , 715n has a steeper voltage increment than the first regulating unit 7111. The comparator compares the voltage division result of each of the second type voltage regulators 7151, 7152, . . . , 715n with a predetermined reference voltage Vref. If the reference voltage Vref is higher than the voltage division result, the comparator causes the division operation on the first voltage V0 to be stopped. On the contrary, if the reference voltage Vref is lower than the voltage division result, the comparator causes the division operation on the first voltage V0 to be performed again. During the active period, each of the second type voltage regulators 7151, 7152, . . . , 715n outputs a voltage division result to the row selection unit 30, instead of the voltage division result provided by the first regulating unit 7111.

The flash memory device 100 generates a plurality of word line voltages needed for operations throughout the voltage generating circuit 70 in advance. Among the constant voltages generated in advance, a selected constant voltage is applied to a corresponding word line. However, there may exist a probability that a reverse leakage current $i_r$ occurs between the generating of the constant voltages and the applying of the selected constant voltage. The probability may be higher when a plurality of transistors are constructed within a single well region like the switching unit 31.

The output terminal for outputting each stand-by constant voltage and the output terminal for outputting each corresponding active constant voltage is shared so that the externally input reverse leakage current $i_r$ is always discharged. For instance, if the leakage current $i_r$ is input through the output terminal of the voltage generating circuit 70, the input leakage current $i_r$ is input into the first type voltage regulator 711 through paths connected to the shared output terminals, wherein the paths are denoted as reference numerals 7161, 7162, . . . , 716n-1, 716n in the drawings. The input leakage current $i_r$ is discharged through the voltage division paths of the first type voltage regulator 711. The path for discharging the input leakage current $i_r$ is configured such that it is connected to the output terminal generating the corresponding stand-by constant voltage. Accordingly, it is possible to effectively eliminate unnecessary reverse leakage current $i_r$ and to maintain constant voltages at predetermined levels.

Figure 7:
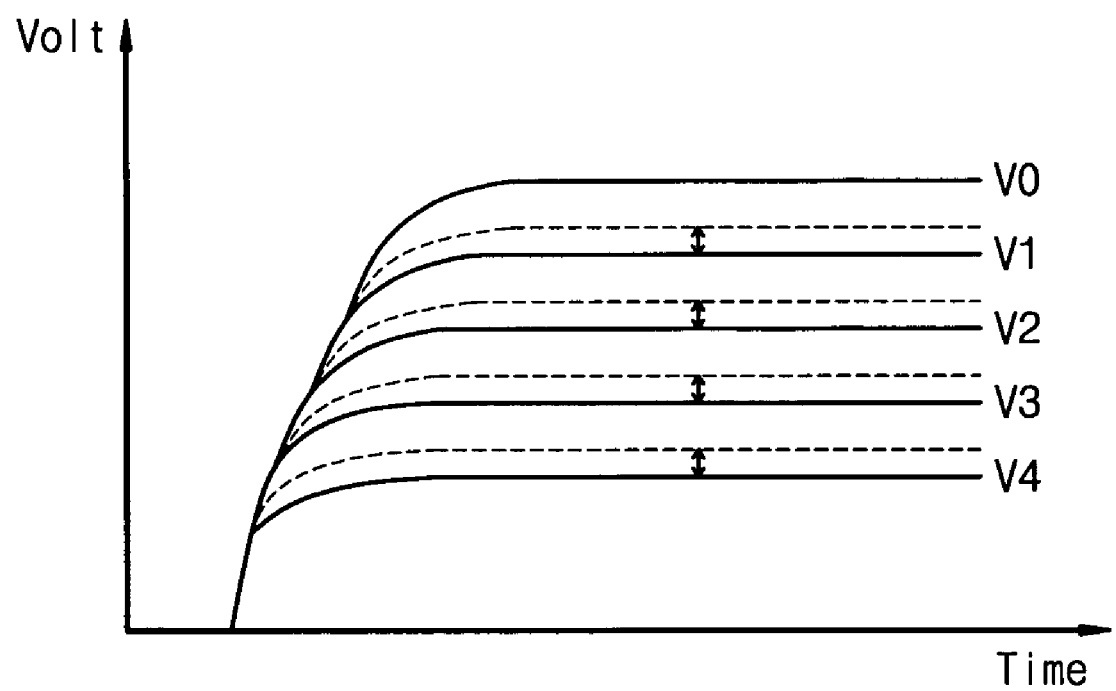
FIG. 7 is a graph illustrating examples of word line voltages generated at the flash memory according to an exemplary embodiment of the present invention.

FIG. 7 is a graph illustrating examples of a plurality of constant voltages V0, V1, V2 and V3 generated by the voltage generating circuit 70 according to an exemplary embodiment of the present invention. FIG. 7 depicts only some of the voltages among the plurality of constant voltages.

In FIG. 7, the solid lines represent the stand-by level constant voltages. The stand-by level constant voltages are generated by the first voltage regulator 711 during the stand-by period. The stand-by level constant voltages are not directly applied to the word line but remain in a stand-by state until the enable signal Enable is activated. In FIG. 7, the dotted line in the graph represents the active level constant voltages. The active level constant voltages are generated by the second type voltage regulator 715 during the active period. Each of the active level constant voltages has a higher voltage level than each of the respective stand-by constant voltages, which means that the voltage is applied to the word line.

Referring to FIG. 7, the voltage generating circuit 70 according to an exemplary embodiment of the present invention generates the plurality of constant voltages with the stand-by level and the active level, respectively. In generating each constant voltage, each of the stand-by voltages is generated in advance and, thereafter, each of the active voltages is generated. Therefore, it is possible to effectively generate high voltages without overstraining the pumping operation of the charge pump.

The voltage generating circuit 70 according an exemplary embodiment of the present invention eliminates reverse leakage current $i_r$ input through the voltage division path included in the first type voltage regulator 711, although the reverse leakage current $i_r$ may be input through the output terminal thereof. Therefore, it is possible to output a constant voltage that is not influenced by externally input reverse leakage current $i_r$. As a result, the program, the erase, and the read operations of the flash memory may be stably performed using the voltage generating circuit 70.

Exemplary embodiments of the voltage generating circuit of the present invention can be applied to various kinds of nonvolatile memory devices such as a mask read-only memory (mask ROM, MROM), a programmable ROM (PROM), an erasable and programmable ROM (EPROM), an electrically EPROM (EEPROM), and so forth, as well as a NAND and a NOR flash memory device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A flash memory device comprising:
   a memory cell array configured with a plurality of memory cells;
   a voltage generating circuit for generating a plurality of constant voltages to be applied to the memory cell array; and
   a selection circuit for selecting one constant voltage among the plurality of constant voltages and applying the selected one constant voltage to the memory cell array,
   wherein the voltage generating circuit discharges a leakage current supplied by the selection circuit through a voltage division path, which generates the constant voltages.

2. The flash memory device of claim 1, wherein each constant voltage has a stand-by voltage level and an active voltage level, wherein the active voltage level is higher than the stand-by voltage level.

3. The flash memory device of claim 1, wherein the voltage generating circuit comprises:
   a charge pump for generating a voltage higher than a power voltage through charge-pumping;
   a first type voltage regulator for generating a plurality of stand-by constant voltages and control signals by dividing the voltage generated by the charge pump during a stand-by period;
   a plurality of second type voltage regulators, wherein each of the second type voltage regulators outputs the stand-by constant voltages to the selection circuit during the stand-by period, and outputs active constant voltages corresponding to the stand-by constant voltages to the selection circuit by dividing the voltage generated by the charge pump during an active period; and
   a control circuit for controlling the charge pumping operation in response to the control signals.

4. The flash memory device of claim 3, wherein the first type voltage regulator comprises a plurality of first output terminals outputting the stand-by constant voltages, wherein the first output terminals are connected respectively to output terminals of the second type voltage regulator.

5. The flash memory device of claim 4, wherein the first type voltage regulator discharges a leakage current supplied by at least one of the first output terminals through the voltage division path.

6. The flash memory device of claim 5, wherein the voltage division path comprises:
   an input terminal for receiving the voltage generated by the charge pump; and
   a plurality of resistors connected in series between the input terminal and a ground for dividing the voltage generated by the charge pump.

7. The flash memory device of claim 1, wherein the selection circuit comprises a plurality of transistors for selectively outputting the plurality of constant voltages, wherein the plurality of transistors are formed in a single well region.

8. A voltage generating circuit comprising:
   a charge pump for generating a voltage higher than a power voltage through charge-pumping;
   a first type voltage regulator for generating a plurality of stand-by constant voltages and control signals by dividing the voltage generated by the charge pump during a stand-by period;
   a plurality of second type voltage regulators, wherein each of the second type voltage regulators outputs the stand-by constant voltages to the selection circuit during the stand-by period, and outputs active constant voltages corresponding to the stand-by constant voltages to the selection circuit by dividing the voltage generated by the charge pump during an active period; and
   a control circuit for controlling the charge pump in response to the control signals.

9. The flash memory device of claim 8, wherein the first type voltage regulator comprises a plurality of first output terminals outputting the stand-by constant voltages, wherein the first output terminals are connected to output terminals of the second type voltage regulator.

10. The flash memory device of claim 9, wherein the first type voltage regulator discharges a leakage current supplied by at least one of the first output terminals through a voltage division path.

11. The flash memory device of claim 10, wherein the voltage division path comprises:
    an input terminal for receiving the voltage generated by the charge pump; and
    a plurality of resistors connected in series between the input terminal and a ground for dividing the voltage generated by the charge pump.

* * * * *